United States Patent [19]

Takata et al.

[11] Patent Number: 4,992,679
[45] Date of Patent: Feb. 12, 1991

[54] PROGRAMMING LOGIC DEVICE WITH MULTIPLE INDEPENDENT FEEDBACKS PER INPUT/OUTPUT TERMINAL

[75] Inventors: Akira Takata; Koichi Fujii, both of Toyonaka, Japan

[73] Assignee: Ricoh Company, Ltd., Tokyo, Japan

[21] Appl. No.: 555,364

[22] Filed: Jul. 16, 1990

Related U.S. Application Data

[60] Continuation of Ser. No. 343,925, Apr. 26, 1989, abandoned, which is a division of Ser. No. 199,122, Aug. 1, 1988, Pat. No. 4,857,773, which is a division of Ser. No. 903,781, Sep. 4, 1986, Pat. No. 4,763,020.

[30] Foreign Application Priority Data

Sep. 6, 1985 [JP] Japan ............................ 60-201358
Sep. 10, 1985 [JP] Japan ............................ 60-204157
Sep. 13, 1985 [JP] Japan ............................ 60-232992
Oct. 17, 1985 [JP] Japan ............................ 60-198102

[51] Int. Cl.$^5$ ............................................. H03K 19/177
[52] U.S. Cl. .................................... 307/465; 307/243; 307/441; 307/469
[58] Field of Search .............. 307/441, 219, 465–469, 307/303.2, 243; 364/716; 365/189.08

[56] References Cited

U.S. PATENT DOCUMENTS

| | | | |
|---|---|---|---|
| 4,664,192 | 2/1987 | Fisher | 307/465 |
| 4,742,252 | 5/1988 | Agrawal | 364/716 X |
| 4,758,746 | 7/1988 | Birkner et al. | 307/465 |
| 4,774,421 | 9/1988 | Hartmann et al. | 307/468 X |

OTHER PUBLICATIONS

Monolithic Memories spec sheet, PAL20RA10, copyright 1985, pp. 1-15.

Primary Examiner—David Hudspeth
Attorney, Agent, or Firm—Cooper & Dunham

[57] ABSTRACT

A programmable logic device includes an AND plane and an OR plane associated with the AND plane. At least one of the AND and OR planes includes an array of programmable memory elements which can be selectively programmed to define a desired logic function. In one form, a function cell designed for providing one of a predetermined functions, such as a counter or shift register function, selectively is provided. In another form, a driver circuit connected to a pair of input lines has a first state in which one of the paired input lines serves as an inverting input line and the other as a non-inverting input line and a second state in which both of the paired input lines are set at low level. In a further form, two pairs of input lines of the AND plane are connected to an input or input/output terminal of the device. In a still further form, the AND plane further includes a plurality of test input lines each associated with the corresponding one of the product term lines of the AND plane, and an three-state output buffer is connected between the OR plane and a device output terminal, whereby the output buffer is enabled by a logical sum between a selected product term from the AND plane and an internally supplied test mode signal.

2 Claims, 13 Drawing Sheets

PROGRAMMING LOGIC DEVICE WITH MULTIPLE INDEPENDENT FEEDBACKS PER INPUT/OUTPUT TERMINAL

This is a continuation of application Ser. No. 343,925, filed Apr. 26, 1989, abandoned, which in turn is a division of application Ser. No. 07/199,122, filed Aug. 1, 1988, now U.S. Pat. No. 4,857,773, which in turn is a division of application Ser. No. 06/903,781, filed Sept. 4, 1986 now U.S. Pat. No. 4,763,020.

BACKGROUND OF THE INVENTION

1. Field of the Invention

This invention relates to a semiconductor logic device, and, in particular, to a programmable logic device including an array of AND and OR gates. A programmable logic device (PLD) includes an AND plane and an OR plane, and there are three variations: (1) both of AND and OR planes are programmable (also referred to as a programmable logic array or PLA); (2) AND plane is programmable but OR plane is non-programmable (also referred to as a programmable array logic or PAL); and (3) AND plane is non-programmable but OR plane is programmable. Here, the term PLD should be understood to include all of these three variations.

2. Description of the Prior Art

A programmable logic device includes an AND plane and an OR plane, at least one of which is provided with a plurality of programmable elements arranged in the form of an array. When programmed, a combinational logic, whether sequential or not, is defined by the programmable elements of the AND and OR planes. When defining a sequential logic, a flip-flop is typically provided in addition to the AND and OR planes, whereby an output from the OR plane is input into the flip-flop. In a programmable logic device provided with a flip-flop, such a logic as a counter or shift register can be defined arbitrarily.

When the degree of integration of such a programmable logic device is increased, if the AND plane includes a plurality of programmable elements, the size of an array in the AND plane increases proportionally depending on a product between twice the number of input lines i and the number of product term lines p (i.e., 2i.p). However, as the size of the array increases, the number of unused programmable elements when defining a logic circuit in the programmable logic device increases. For example, when defining a 4-bit counter using four sets of PALs, each set including a programmable AND array having 50 input lines, a fixed OR array having 8 input lines, and one flip-flop, the number of actually used programmable elements is 74 even if a total of 3,200 programmable elements are provided in the device. Thus, a majority of the programmable elements remains unused, and this tendency is pronounced as the size of a programmable logic device further increases.

SUMMARY OF THE INVENTION

In accordance with one aspect of the present invention, there is provided a programmable logic device including a plurality of programmable elements arranged in the form of an array and at least one function cell which is previously so structured to provide a predetermined function, such as a counter or shift register. With the provision of such a function cell in a programmable logic device, the number of unused programmable elements in the programmable logic device can be significantly reduced.

In accordance with another aspect of the present invention, there is provided a programmable logic device including a plurality of programmable elements arranged in the form of an array and means for setting a pair of input lines connected to a non-used input signal line at low level, thereby minimizing leakage current. In a programmable logic device, a plurality of input terminals are provided and a pair of input lines extends from an associated one of the input terminals in a direction transverse to a plurality of product term lines. A programmable element is disposed at each of the cross-over points between the input and product term lines. The pair of input lines is so structured that one of them carries a non-inverted signal and the other carries an inverted signal. In this aspect of the present invention, those pair of input lines connected to non-used input terminals are all set at low level, so that leakage current is minimized.

In accordance with a further aspect of the present invention, there is provided a programmable logic device in which at least two pairs of input lines, each pair including a inverting input line and a non-inverting input line, are connected to at least one input or input-/output terminal of an AND array.

In accordance with a still further aspect of the present invention, there is provided a programmable logic device capable of controlling an output buffer by internal product terms, thereby allowing to carry out logic test and measurements of input/output propagation time delay without programming the internal programmable elements.

It is therefore a primary object of the present invention to provide an improved programmable logic device having a minimized number of non-used programmable elements when a logic circuit is defined.

Another object of the present invention is to provide an improved programmable logic device fast in operation and low in leakage current.

A further object of the present invention is to provide a programmable logic device having a structure to allow to use its input and input/output terminals effectively.

A still further object of the present invention is to provide a programmable logic device which allows to carry out logic test and measurements of input/output propagation time delays without actually programming the interior programmable elements.

A still further object of the present invention is to provide an improved programmable logic device having an AND plane and an OR plane, at least either one of which includes a plurality of programmable elements arranged in the form of an array.

A still further object of the present invention is to provide an improved reprogrammable logic device having an AND plane and an OR plane, at least either one of which includes a plurality of reprogrammable elements arranged in the form of an array.

Other objects, advantages and novel features of the present invention will become apparent from the following detailed description of the invention when considered in conjunction with the accompanying drawings.

DESCRIPTION OF THE PREFERRED EMBODIMENTS

It is to be noted that the term "programmable logic device" is used here to include an AND plane and an OR plane, at least either one of which includes an array of programmable elements. Thus, one form of the programmable logic device includes a programmable AND plane and a programmable OR plane, which is often referred to as PLA. A second form of the programmable logic device includes a programmable AND plane and a non-programmable OR plane, which is often referred to as PAL. A third form of the programmable logic device includes a non-programmable AND plane and a programmable OR plane. It should further be noted that the programmable logic device can either be reprogrammable or non-reprogrammable. The programmable element may be a reprogrammable transistor, such as a floating-gate MOS transistor or a stacked-gate MOS transistor, a bipolar transistor, or a fusable link.

Figure 1:
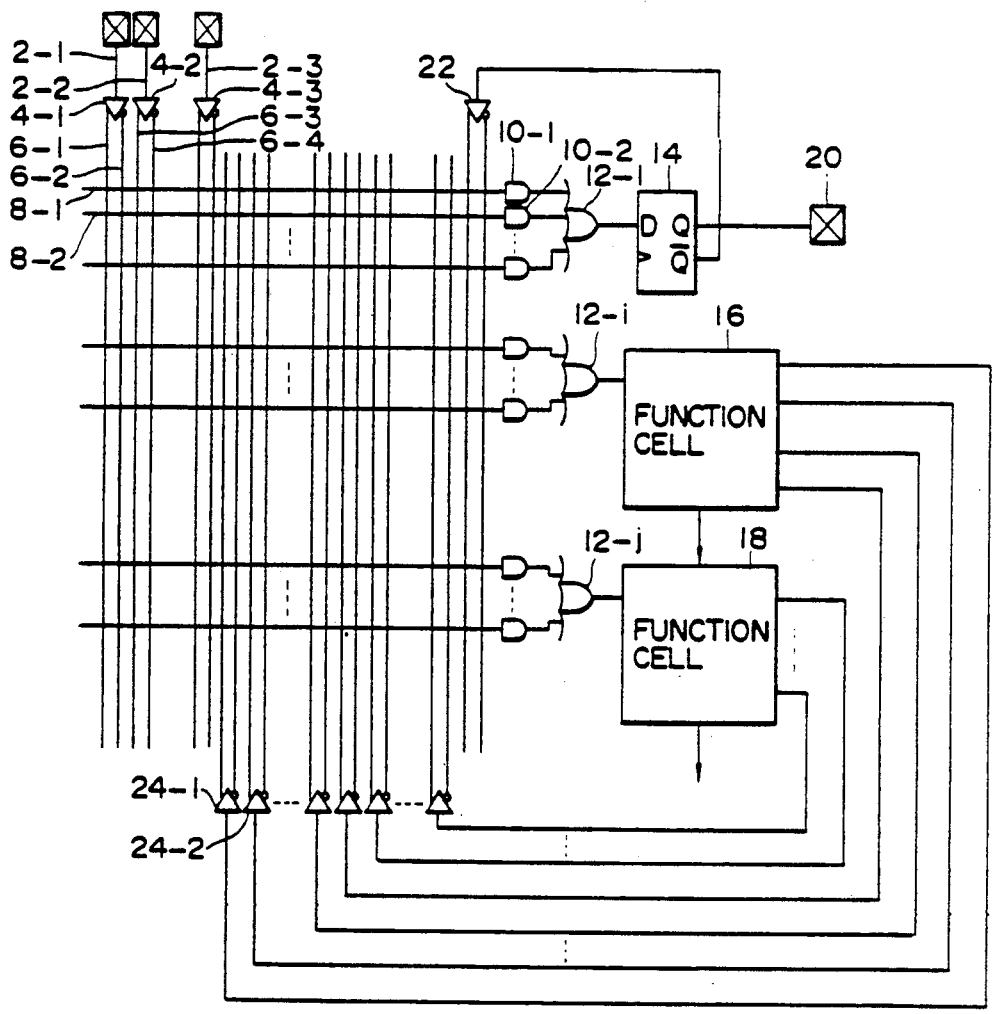
FIG. 1 is a schematic illustration showing a programmable logic device including function cells constructed in accordance with one embodiment of the present invention.

Referring now to FIG. 1, there is schematically shown a programmable logic device having a programmable AND plane and a non-programmable or fixed OR plane constructed in accordance with one embodiment of the present invention. The OR plane is fixed so that the logic defined in the OR plane is fixed and cannot be altered by programming. On the other hand, the AND plane is programmable so that a desired logic function can be programmed in the AND plane.

The illustrated programmable logic device includes a plurality of connection lines 2-i, each comprised of an electrical conductor and connected to an associated one of a plurality of input terminals at one end and to an associated one of a plurality of input buffer circuits 4-i. It is to be noted that i indicates an integer number. A pair of inverting and non-inverting input lines 6-(even number) and 6-(odd number) extend vertically from an associated one of the plurality of input buffer circuits 4-i. Each of the vertically extending input lines 6 is comprised of an electrical conductor. Also provided are product term lines 8-i which are comprised of horizontally extending electrical conductors and connected to respective sense amps 10-i. Although not shown specifically, a programmable element or a stacked-gate or double-gate MOS transistor is disposed at each crossover point between the vertically extending input lines 6 and the horizontally extending product term lines 8. Thus, the input lines 6 may be coupled to one or more of the product term lines 8 by programming one of more of the associated programmable elements.

The sense amps 10 are grouped and the output terminals of the sense amps 10 in each group are connected to the input terminals of an associated OR gate 12. The first OR gate 12-1 has its output terminal connected to a D input terminal of a flip-flop 14. Another OR gate 12-i has its output terminal connected to an input terminal of a function cell 16 which will be described in detail later. Also shown is a further OR gate 12-j which has its output terminal connected to an input terminal of another function cell 18. On the other hand, the flip-flop 14 has its output terminal Q connected to a device output terminal 20 and its other output terminal $\overline{Q}$ connected to a feed-back circuit which is connected to a pair of input lines in the AND plane through an input buffer circuit 22.

Each of the function cells 16 and 18 is so structured that it can be used as a 4-bit shift register or counter, and the output terminals of the function cells 16 and 18 are connected to feed-back circuits which are connected to paired input lines in the AND plane through respective input buffer circuits 24-i. It is also so structured that two or more of the function cells 16, 18, . . . may be interconnected to provide an element having a desired function, such as a shift register or a counter, having eight or more bits. It is to be noted that more than two functional cells may be provided, though only two of such functional cells are shown in FIG. 1. Furthermore, although the output terminals of the function cells 16 and 18 are connected to the feed-back circuits extending to the AND plane in the structure shown in FIG. 1, they may be connected to an external circuit partly or wholly, if desired.

Figure 2:
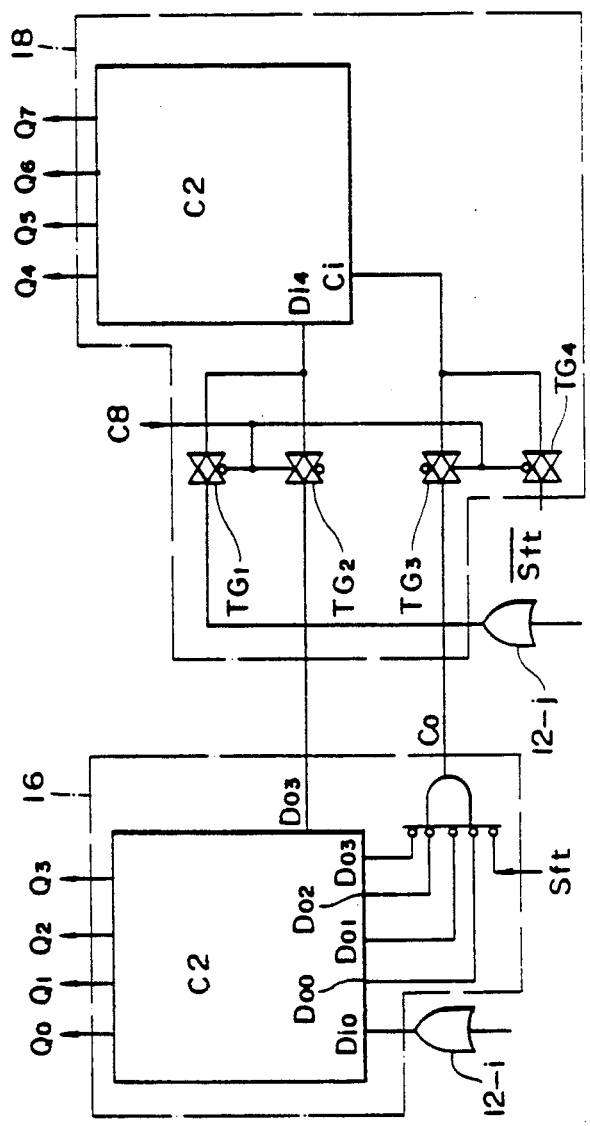
FIG. 2 is a schematic illustration showing a specific example of a function cell provided in the structure shown in FIG. 1.
Figure 3:
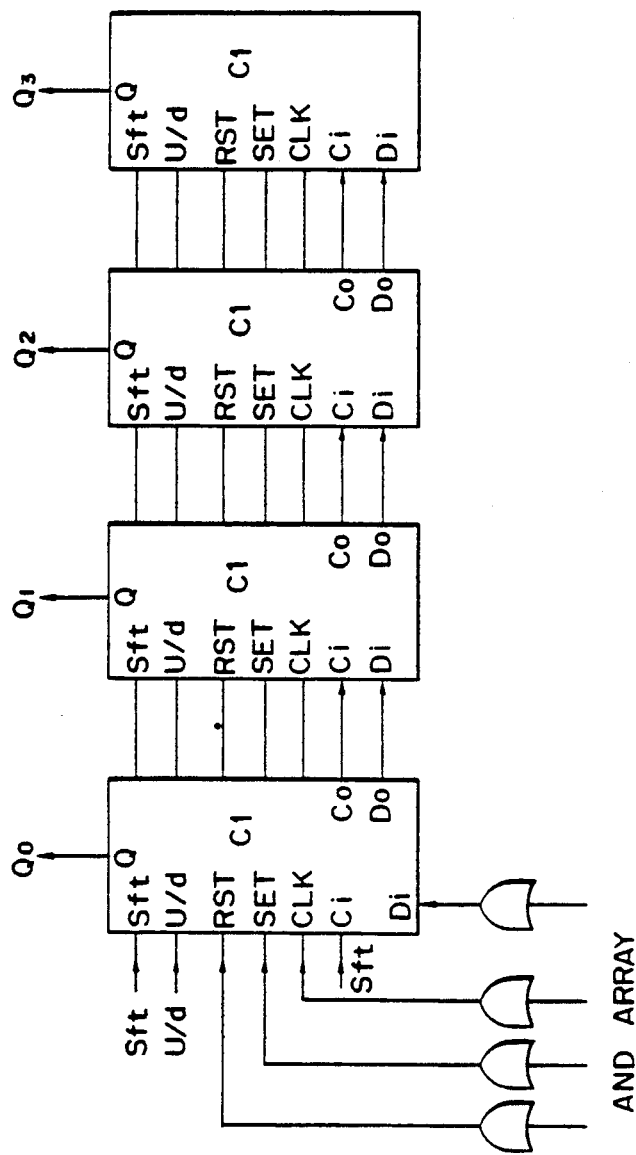
FIG. 3 is a schematic illustration showing the detailed structure of C2 circuit shown in FIG. 2.
Figure 4:
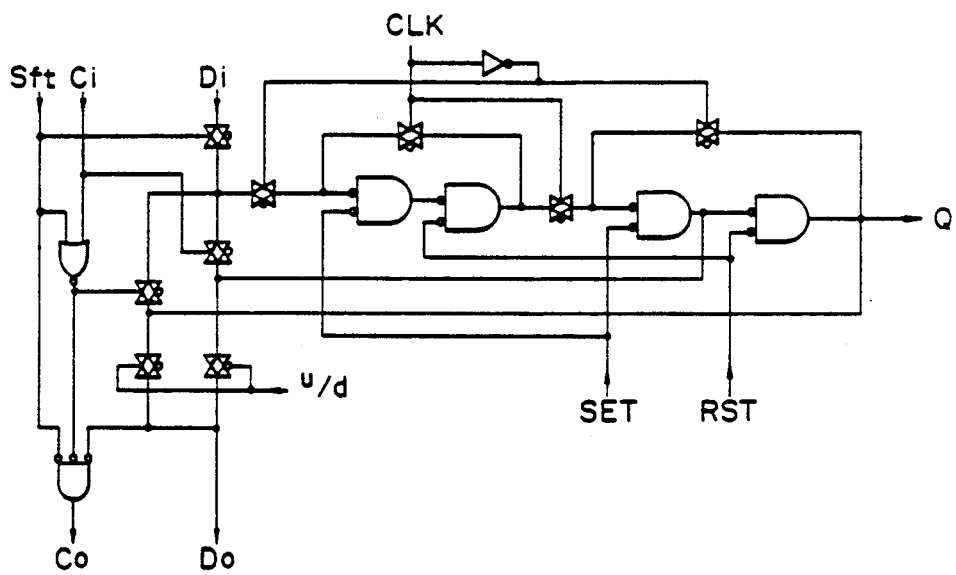
FIG. 4 is a schematic illustration showing the detailed structure of C1 circuit shown in FIG. 3.

FIGS. 2 through 4 show specific examples of the function cells 16 and 18 shown in FIG. 1. The illustrated example is the case in which the function cells 16 and 18 are so structured that they can realize an up-counter, a down-counter or a shift register selectively by a common switching circuit.

FIG. 2 shows a connection between between the function cells 16 and 18. As shown, each of the function cells 16 and 18 includes a circuit C2 which can be defined as a 4-bit counter or shift register. Data input/output Do3 and Di4 between the two function cells 16 and 18 and carry input/output signals Co and Ci are controlled by transfer gates TG1 through TG4 which, in turn, are controlled by a signal C8. When the signal C8 is programmed at low level ("0"), the transfer gates TG2 and TG3 are turned off so that the function cells 16 and 18 are disconnected from each other, and the transfer gates TG1 and TG4 are turned on so that each of the function cells 16 and 18 is established as a 4-bit counter or shift register. On the other hand, when the signal C8 is programmed to be high level ("1"), the transfer gates TG2 and TG3 are turned on, thereby causing both of the function cells 16 and 18 to be connected to each other, and the transfer gates TG1 and TG4 are turned off, thereby causing both of the function cells 16 and 18 to establish an 8-bit counter or shift register.

The detailed structure of the C2 circuit contained in each of the function cells 16 and 18 is shown in FIG. 3, and, as shown, the circuit C2 is a 4-bit circuit comprised of four C1 circuits connected in series. The detailed structure of the circuit C1 is shown in FIG. 4. In FIGS. 3 and 4, "Sft" is a shift register selection signal and "u/d" is a selection signal for selecting either up type or down type of the counter. If both of the Sft and u/d signals are programmed at high level, the circuit shown in FIG. 3 serves as a 4-bit shift register. If it is so programmed that the Sft signal is low and the u/d signal is high, then a 4-bit down counter is realized. On the other hand, if both of the Sft and u/d signals are programmed to be low in level, then there is established a 4-bit up counter. This may be summarized in the form of a table below.

| Sft | u/d | Function |
|---|---|---|
| 1 | 1 | 4-bit shift register |
| 0 | 1 | 4-bit down counter |
| 0 | 0 | 4-bit up counter |

These signals Sft, u/d and C8 have nothing to do with the operational speed, and they are only required to maintain a constant value while the programmable logic device is in operation.

Figure 5:
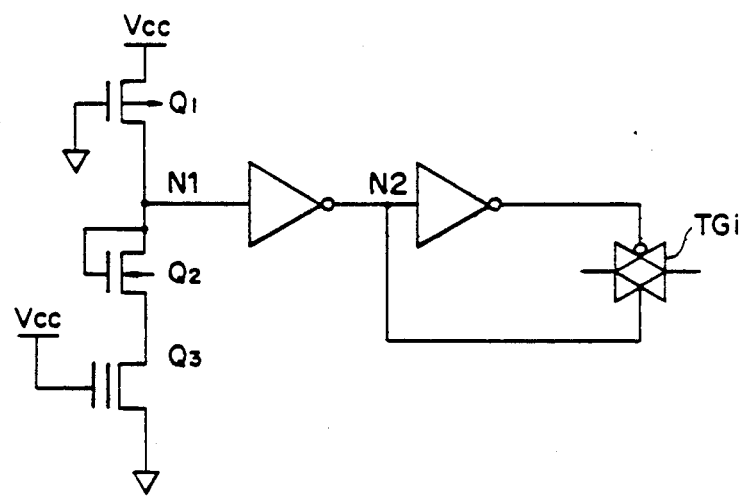
FIG. 5 is a schematic illustration showing a control circuit for controlling the operating mode of the function cell provided in the structure shown in FIG. 1.

FIG. 5 shows a circuit for programming these signals Sft, u/d and C8. The programming circuit shown in FIG. 5 includes a transfer gate TGi and a stacked-gate MOSFET Q3 as a programmable element for programming the signals SFt, u/d and C8. This programmable element Q3 is same in kind as the programmable elements employed in the AND plane in the structure of FIG. 1. The programming circuit further includes a pull-up element Q1 and a current-limiting MOS transistor Q2 which limits the current applied to the drain of the transistor Q3. If the memory cell transistor Q3 is in a deprogrammed state, then a node N1 is at low level and a node N2 is at high level, so that the transfer gate TGi is turned on. On the other hand, if the memory cell transistor Q3 is in a programmed state, then the node N1 is at high level and the node N2 is at low level, so that the transfer gate TGi is turned off.

In this manner, in accordance with this aspect of the present invention, there is provided a programmable logic device provided with at least one function cell which is so structured that a circuit having a desired function, which is often used, can be selectively established. Thus, a relatively large logic function can be realized without increasing the number of programmable elements in the AND or OR plane unduly.

Another aspect of the present invention will now be described with reference to FIGS. 6 through 11. FIG. 9 shows a prior art programmable logic device having an AND plane including a plurality of reprogrammable memory elements and a non-programmable OR plane. As shown in FIG. 9, the AND plane includes a plurality of vertically extending input lines 108, a plurality of horizontally extending product term lines 102, a plurality of stacked-gate MOSFETs 104 as reprogrammable memory elements each of which is disposed at a crossover point between the vertically extending input lines 108 and the horizontally extending product term lines 102. It is to be noted that the input and product term lines 108 and 102 are all comprised of electrical conductors. Each of the stacked-gate MOSFET 104 has its control gate connected to its associated input line 108, its one drain/source connected to its associated product term line 102, and its other source/drain connected to a reference potential. Each of the product term lines 102 is connected at its one end to an associated AND sense circuit 106 which serves to detect whether the current $I_p$ flowing along the associated product term line 102, thereby determining whether or not the AND circuit is logically high ("1") or low ("0"). It is to be noted that in the illustrated example the AND circuit is in the form of a NOR structure.

The input lines 108 are paired and each pair includes an inverting input line and a non-inverting input line, which are driven by a driver circuit 114 comprised of two serially connected inverters. A plurality of OR circuits 112 are provided and each of the OR circuits 112 has a plurality of input terminals each of which is connected to the output terminal of the associated sense circuit 106. The plurality of OR circuits 112 define a fixed or non-programmable OR plane in the illustrated programmable logic device. Also provided are a plurality of input terminals 110 which are respectively connected to its associated driver circuit 114 through a connecting line 110. Also provided is a feed-back circuit 110 between the OR plane and the AND plane, and a device output terminal 117 is connected to the output terminal of its associated OR circuit 112-k.

Figure 9:
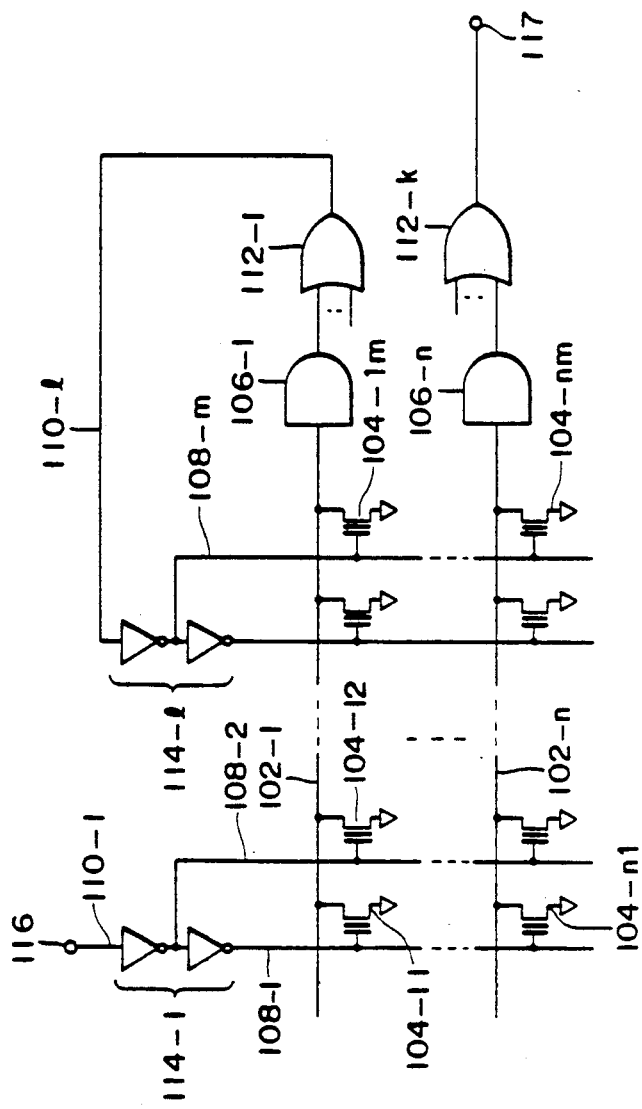
FIG. 9 is a schematic illustration showing a prior art programmable logic device having a programmable AND plane and a fixed OR plane.
Figure 10:
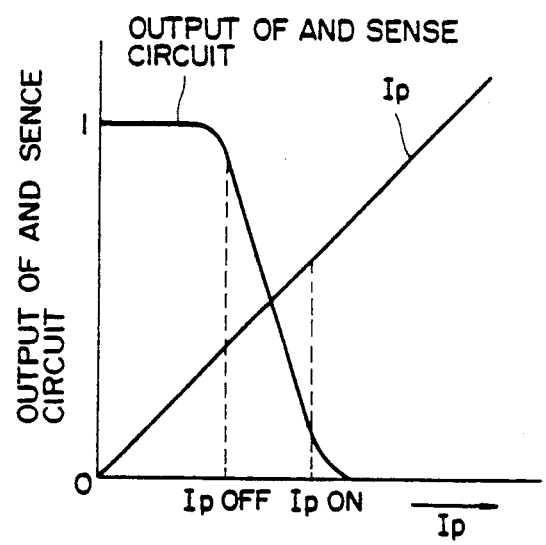
FIG. 10 is a graph which is useful for understanding the operation of the AND sense circuit in the structure of FIG. 9.
Figure 11:
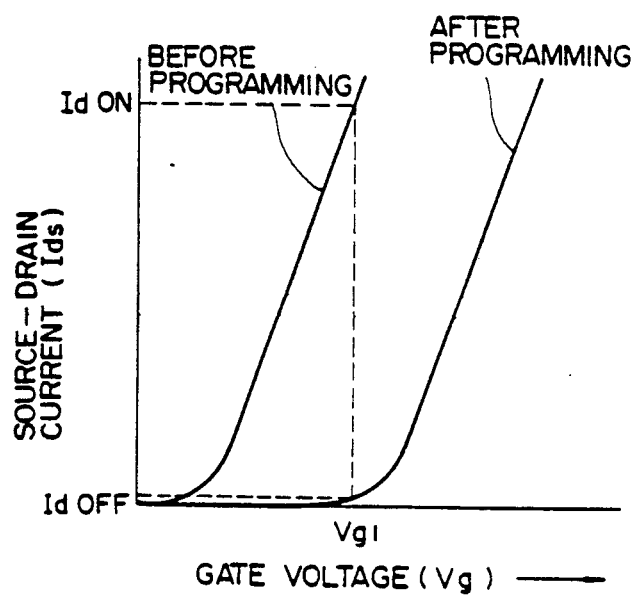
FIG. 11 is a graph which is useful for understanding the operation of FAMOS transistor when used as a programmable element in the structure of FIG. 9.

The characteristic of each of the sense circuits 106 is shown in FIG. 10. That is, if current $I_p$ on each of the product term lines 102-1 through 102-n is equal to or lower than a first predetermined level ($I_p$OFF), then the associated sense circuit 106 supplies logic "1" as its output; whereas, if current $I_p$ is higher than a second predetermined level ($I_p$ON), then the associated sense circuit 106 supplies logic "0" as its output. FIG. 11 shows the characteristic of a FAMOS transistor, such as shown 104 in FIG. 9, and Vg1 in FIG. 11 indicates a voltage when the gate voltage is at high level. When the gate voltage of a FAMOS transistor is at high level (Vg1), drain-source current (Ids) of a FAMOS transistor before programming is IdON; whereas, the drain-source current (Ids) after programming is IdOFF. Typically, IdON is in a range between 30 micro-A and 100 micro-A, and IdOFF is in a range between a few nano-A and 0.1 micro-A.

It is normally so structured that in the case where there is one input line which is not used for all of the product term lines, no current flows between the drain and the source even if all of the memory elements associated with that non-used input line are programmed and thus the gates are set at high level. However, as a typical characteristic of a MOSFET memory element, current IdOFF does not become zero, but there is a slight leakage current ranging between a few nano-A and 0.1 micro-A. The AND sense circuit defining a product term determines whether or not current flows along the associated product term line. If the number of MOSFET memory elements associated with a single product term line is 2n, since a complementary signal opposite in polarity to an input signal is applied to the gates of the MOSFET memory elements, the gates of n number of memory elements is set at high level. In other words, IpOFF is a sum of IdOFF(i) wherein i changes from 1 to n. As a result, if the number n of memory elements, IpOFF also increases, and, thus, it takes more time for the AND sense circuits 106 to carry out detection.

Figure 6:
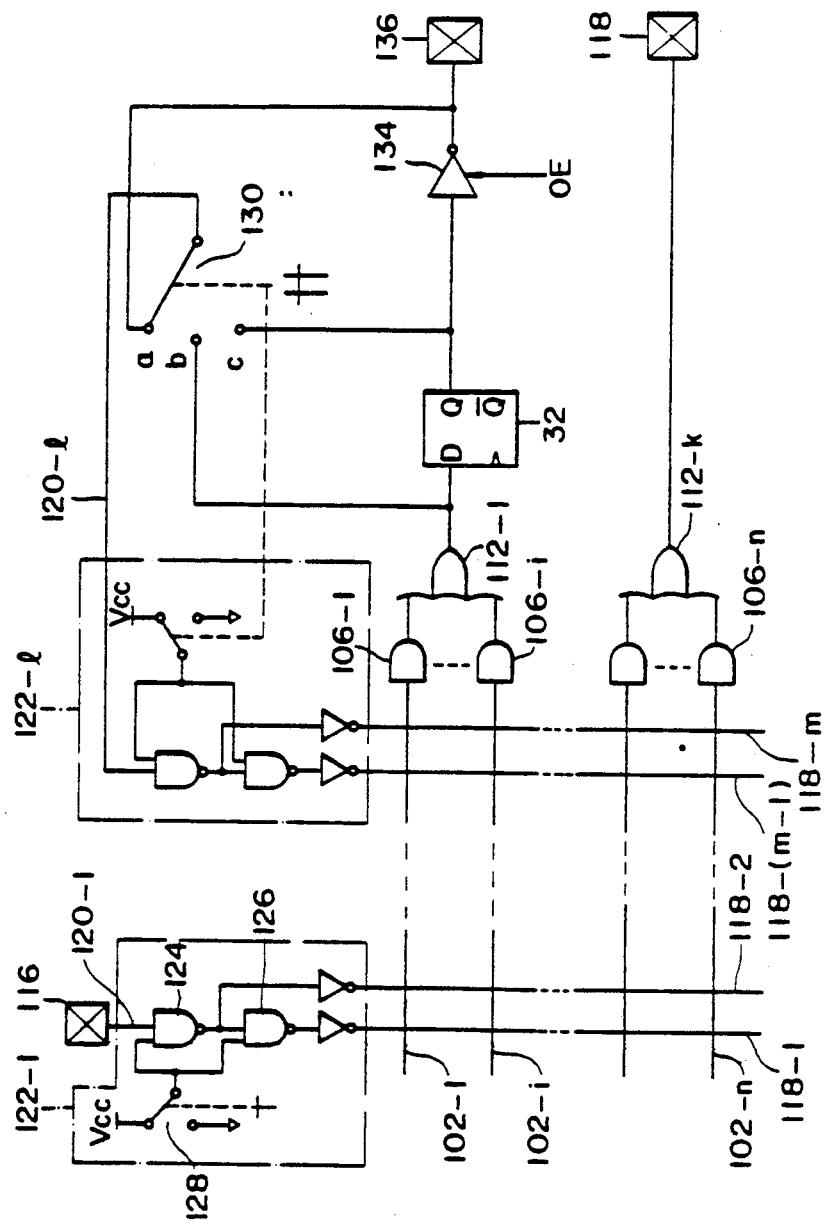
FIG. 6 is a schematic illustration showing a programmable logic device including a driver circuit for controlling the logic state of paired input lines construed in accordance with another embodiment of the present invention.

This aspect of the present invention is directed to obviate the above-described disadvantage and FIG. 6 shows a programmable logic device having a programmable AND plane and a non-programmable OR plane constructed in accordance with a further embodiment of the present invention. As shown, in the AND plane, a reprogrammble memory element similar to that shown in FIG. 9 is provided at each of the cross-over points between the vertically extending input lines 118 and the horizontally extending product term lines 102, through such a memory element is not specifically shown in FIG. 6. Each of the product term lines 102 is connected at its right-hand end to an associated one of AND sense circuits 106, which are divided into a plurality of groups. Those AND sense circuits 106 which are in the same group have their output terminals connected to the respective input terminals of an associated one of a plurality of OR circuits 112, which define the fixed and thus non-programmable OR plane. The portion of the structure shown in FIG. 6 which has thus been described is similar to that of the programmable logic device shown in FIG. 9.

As shown in FIG. 6, the present programmable logic device also includes a plurality of device input terminals 116 each of which is connected to an associated one of driver circuits 122 through a connecting or input singal line 120. A pair of inverting and non-inverting input lines 118 runs vertically from each of the driver circuits 122. Each of the driver circuits 122 includes a pair of serially connected NAND circuits 124 and 126, each of which has its one input terminal (for receiving a control signal) connected to a switch circuit 128 which is programmed to be at high level ($V_{cc}$) or low level (ground) by means of a reprogrammable memory element. The NAND circuit 124 has its output terminal connected to one of a pair of inverting and non-inverting input lines 118 through an inverter and the NAND circuit 126 has its output terminal connected to the other of the pair of inverting and non-inverting input lines 118 through another inverter. Although not shown specifically, it should be noted that the reprogrammable memory element for setting the state of the switch circuit 128 is of the same type as those provided at the cross-over points between the input lines 118 and the product term lines 102 in the AND plane.

In the driver circuit 122, if the switch circuit 128 is programmed to supply a high level signal, the associated pair of inverting and non-inverting input lines, e.g., 118-1 and 118-2, will function in a manner similar to the corresponding pair of inverting and non-inverting input lines 108-1 and 108-2 in the structure of FIG. 9. On the other hand, if the switch circuit 128 is programmed to supply a low level signal, the associated pair of inverting and non-inverting input lines 118-1 and 118-2 are both forcibly set at low level.

The programmable logic device shown in FIG. 6 also includes a driver circuit 122-1 which is connected to a feed-back loop 120-1 from the fixed OR plane instead of a device input terminal. The driver circuit 122-1 has a structure similar to that of the driver circuit 122-1 connected to the device input terminal 116, and the driver circuit 122-1 is connected a pair of inverting and non-inverting input lines 118-(m-1) and 118-m which run in the vertical direction crossing the product term lines 102. Although only one for each of two kinds of driver circuits 122-1 and 122-1 is shown in FIG. 6, these driver circuits 122-1 and 122-1 may be provided as many as desired.

In the structure shown in FIG. 6, the output terminal of the OR circuit 112-1 is connected to an input terminal D of a register 32 and also to a contact point b of a switch 130 which is connected to the feed-back loop 120-1. The register 32 has its output terminal Q connected to an input/output terminal 136 through a three-state buffer circuit 134 and also to a contact point c of the switch 130 which also has a contact point a connected to the input/output terminal 136. Although not shown specifically, it is so structured that the switch 130 may be operated to switch to a selected one of the contact points a though c by means of a reprogrammable memory element same in kind as those provided in the AND plane. Thus, depending on the condition of the switch 130, the feed-back loop 120-1 can select either one of an input signal from the input/output terminal 136, an output signal from the OR circuit 112-1 and an output signal from the output terminal Q of the register 32. When the three-state buffer circuit 134 is turned on by means of an enable signal OE, the input-/output terminal 136 will serve as an output terminal; whereas, when the three-state buffer 134 is turned off, the input/output terminal 136 serves as an input terminal.

Figure 7:
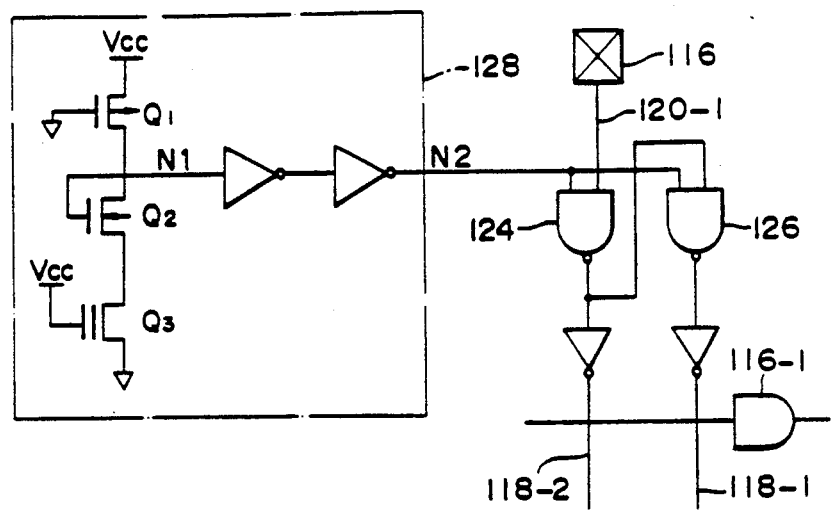
FIG. 7 is a schematic illustration showing the detailed structure of the driver circuit shown in FIG. 6.

The detailed structure of one example of the driver circuit 122 is shown in FIG. 7. The switch circuit 128 includes a MOSFET Q1, which is connected to a power supply voltage $V_{cc}$ and serves as a pull-up load resistor, a MOSFET Q3, which is connected to ground and serves as a memory transistor, and a MOSFET Q2 which serves as a voltage limiting transistor for limiting the voltage to be applied to the drain of the MOSFET Q3. The memory transistor Q3 has its control gate connected to a power supply voltage $V_{cc}$, and a node N1 between the transistors Q1 and Q2 is connected to one input terminal (control input terminal) of each of NAND circuits 124 and 126 through a pair of serially connected inverters. There is also provided a circuit for programming or deprogramming the memory transistor Q3 in the switch circuit 128, though such a circuit is not shown specifically in FIG. 7 for the sake of brevity.

In the driver circuit shown in FIG. 7, if the memory transistor Q3 is in a deprogrammed state, the condition at the node N1 is at low level, and, thus, a control signal to be supplied to each of the NAND circuits 124 and 126 is also at low level, so that both of the associated pair of inverting and non-inverting input lines 118-1 and 118-2 are set at low level. On the other hand, if the memory transistor Q3 is set in a programmed state, the memory transistor Q3 is set in a turned off condition, which causes the voltages at the nodes N1 and N2 at high level, so that an inverted signal appears on the inverting input line 118-1 and a non-inverted signal appears on the non-inverting input line 118-2. It is to be noted that the driver circuit 122-1 may have the same structure as shown in FIG. 7. In the driver circuit shown in FIG. 7, it is so structured that an associated pair of input lines, e.g., 118-1 and 118-2, is enabled when the memory transistor Q3 is programmed; however, as a modification, it may also be so structured that the associated pair of input lines is disabled when the memory transistor Q3 is programmed by adding another inverter at the node N2.

Returning to FIG. 6, as a means for operating the switch 130, use may be made of a switch circuit similar to the switch circuit 128 shown in FIG. 7. In this case, since there are three contact points a through c, there must be provided two memory elements. With the use of two memory elements, one of four possible states can be selected. Thus, with these two memory elements, an initial condition without programming can be used for controlling the NAND circuit of the feed-back loop 120-1. With this structure, if the feed-back loop is not used, the associated pair of inverting and non-inverting input lines is automatically set in a disabled state.

In the structure shown in FIG. 6, it is so programmed that, among input signal lines 12-1 through 120-1, for those input signal lines which are not to be used, the switch circuit 128 of each of the associated driver circuits 122 is switched to supply a low level output signal, and, for those input signal lines which are to be used, the switch circuit 128 of each of the associated driver circuits 122 is switched to supply a high level output signal. With this, those input lines connected to the input signal lines to be used will function in a manner similar to the conventional input lines as shown in FIG. 9; on the other hand, those input lines connected to the input signal lines not to be used will be all set at low level at all times.

Figure 8:
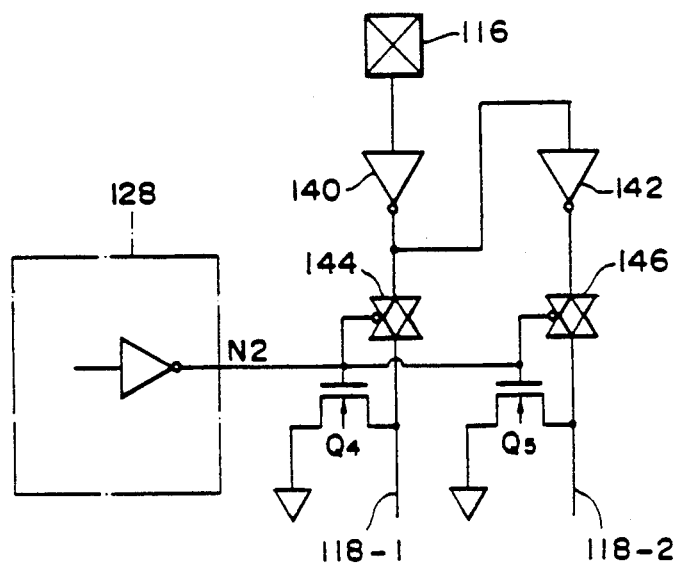
FIG. 8 is a schematic illustration showing the detailed structure of a driver circuit constructed in accordance with a further embodiment of the present invention.

FIG. 8 shows another example of the driver circuit 122 which may be advantageously used in the structure shown in FIG. 6. In the present example, the device input terminal 116 is connected to the input line 118-1 through an inverter 140 and a transfer gate 144, which are connected in series. The output terminal of the inverter 140 is connected to the other input line 118-2 through another inverter 142 and another transfer gate 146, which are connected in series. The input lines 118-1 and 118-2 are paired and MOSFETs Q4 and Q5 are connected to the respective input lines 118-1 and 118-2. The output terminal of the switch circuit 128 or node N2 is connected to the gate of each of the MOSFETs Q4 and Q5 and of the transfer gates 144 and 146. Thus, when the transfer gates 144 and 146 are turned on, the MOSFETs Q4 and Q5 are turned off; on the other hand, when the transfer gates 144 and 146 are turned off, the MOSFETs Q4 and Q5 are turned on.

As described above, in accordance with this aspect of the present invention, a pair of inverting and non-inverting input lines, which is not used for all of the product term lines, is set at low level. Thus, the leakage current associated with the MOS type memory elements connected to these input lines can be significantly limited and there will be no significant delay in operation.

Now, a further aspect of the present invention will be described with particular reference to FIGS. 12 through 16.

Figure 16:
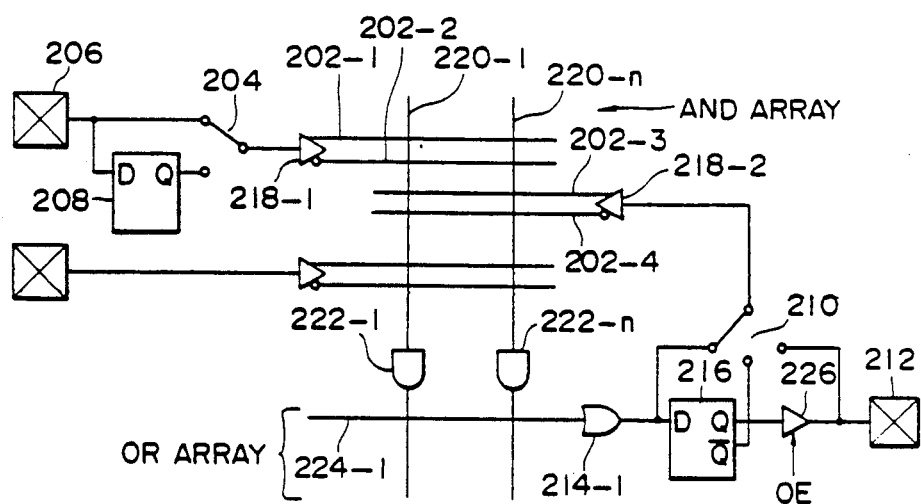
FIG. 16 is a schematic illustration showing another prior art programmable logic device having a programmable AND plane and a programmable OR plane.

Typically, a prior art programmable logic device includes a pair of inverting and non-inverting input lines for each of device input or input/output terminals, as shown in U.S. Pat. No. 4,124,899. FIG. 16 shows another prior art programmable logic device, in which case, selection can be made by a switch 204 whether the paired horizontally running inverting and non-inverting input lines 202-1 and 202-2 receive an input signal directly from its associated input terminal 206 or the paired input lines 202-1 and 202-2 receive an input signal applied to the input terminal 206 through a register 208 comprised of a flip-flop. In addition, it can be selectively programmed by a switch 210 such that another pair of input lines 202-3 and 202-4 receives an output signal from its associated OR sense circuit 214-1 directly, an output signal from the OR sense circuit 214-1 through a register 216, or an input signal applied to the input/output terminal 212 directly. In this prior art programmable logic device also, only a pair of inverting and non-inverting input lines is provided for each of the input or input/output terminal 206 or 212.

The prior art programmable logic device shown in FIG. 16 also includes a plurality of input line driver circuits 218, a plurality of vertically running product term lines 220, a plurality of AND sense circuits 222 each of which is connected to an associated one of the product term lines 220 at its one end, a plurality of output lines 224 each of which extends from the output terminal of its associated AND sense circuit 222, and at least one three-state buffer circuit 226. The input lines 220 extend horizontally and the product term lines 202 extend vertically, so that a matrix is defined by the crossing input and product term lines 220 and 202. A programmable memory element, which may be programmed either to a conducting or non-conducting state preferably alterably, is provided at each cross-over point between the input and product term lines 202 and 220 and between the output and product term lines 224 and 220. Thus, both of the AND and OR planes are programmable in the structure shown in FIG. 16.

However, with the structure shown in FIG. 16, if the register 216 connected to the device input/output terminal 212 is to be used as a state memory register for the feed-back loop to the AND plane, the input/output terminal 212 becomes useless. That is, under the circumstances, the input/output terminal 212 can be used to take out a redundant output signal from the state register 216, but it cannot be used as an input terminal. In addition, at the side of the device input terminal 206, if the register 208 is to be used for using both of a synchronous input signal and an asynchronous input signal, two input signals are required. In general, in the case of a programmable logic device, due to the limitation imposed by the number of terminals or pins of a package, the number of input and output signals to be used is limited. Nonetheless, it cannot be said that the device input and input/output terminals of a prior art programmable logic device have been used effectively.

Figure 12:
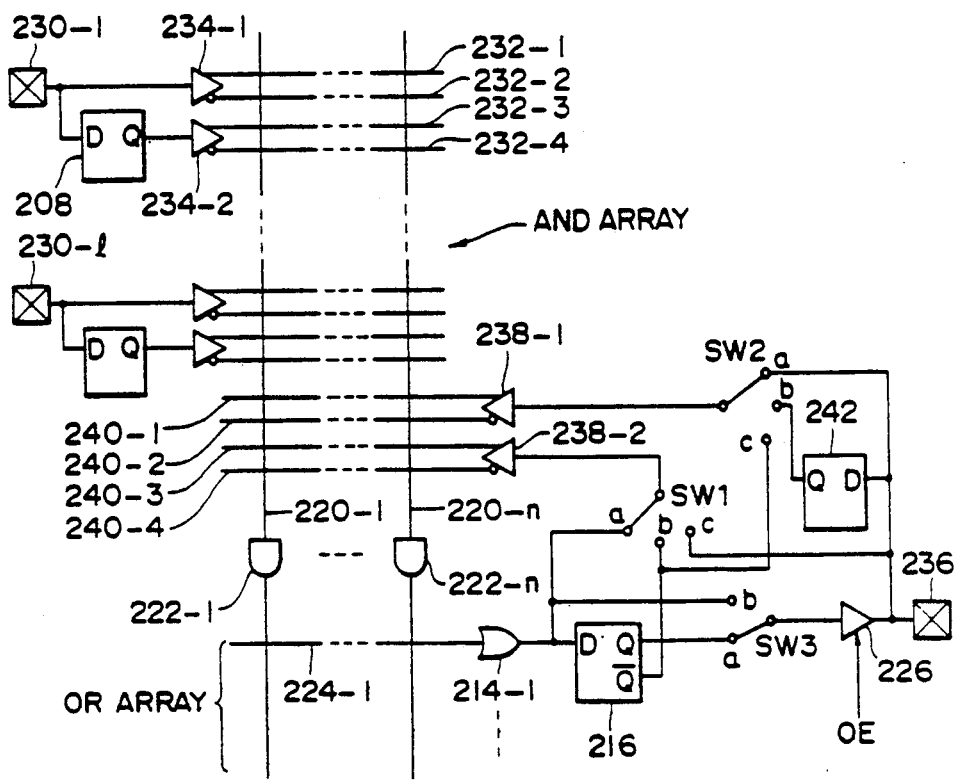
FIG. 12 is a schematic illustration showing a programmable logic device including two pairs of inverting and non-inverting input lines connected to the same input terminal constructed in accordance with a still further object of the present invention.

FIG. 12 shows a programmable logic device constructed in accordance with a further embodiment of the present invention particularly directed to obviate the above-described disadvantages. The illustrated programmable logic device includes an AND plane and an OR plane both of which are programmable, though this aspect of the present invention is also equally applicable to other forms of a programmable logic device as mentioned before. It is also to be noted that those elements identical to those shown in FIG. 16 are indicated by like numerals.

The programmable logic device shown in FIG. 12 includes a plurality of device input terminals 230. For example, a device input terminal 230-1 is connected not only to a driver circuit 234-1 for driving a pair of inverting and non-inverting input lines 232-1 and 232-2 extending horizontally, but also to the input terminal D of a register 208 which has its output terminal Q connected to a driver 234-2 for driving another pair of inverting and non-inverting input lines 232-3 and 232-4 which also run in the horizontal direction. Among the paired input lines 232-1 and 232-2 connected to the driver circuit 234-1, the input line 232-1 carries a non-inverting signal of an input signal applied to the input terminal 230-1; whereas, the other input line 232-2 carries an inverted signal of an input signal applied to the input terminal 230-1. On the other hand, among the paired input lines 232-3 and 232-4 connected to the driver circuit 234-2, the input line 232-3 carries a non-inverting signal of an output signal from the register 208; whereas, the other input line 232-4 carries an inverted signal of an output signal from the register 208. In this manner, in the present embodiment, for the device input terminal 230-1, there are provided two pairs of input lines: a first pair including input lines 232-1 and 232-2 and a second pair including input lines 232-3 and 232-4. It may be easily seen that two pairs of input lines are similarly provided for another input terminal 230-1.

For the device input/output terminal 236, provision is made of two input line driver circuits 238-1 and 238-2. The driver circuit 238-1 has its input terminal connected to a switch SW2, and the input terminal of the driver circuit 238-2 is connected to another switch SW1. The driver circuit 238-1 has its pair of output terminals connected to a pair of input lines 240-1 and 240-2, whereby the input line 240-1 carries a non-inverting signal of a signal selected by the switch SW2 and the other input line 240-2 carries an inverted signal of a signal selected by the switch SW2. Similarly, the other driver circuit 238-2 is also connected to a pair of input lines 240-3 and 240-4 with the input line 240-3 carrying a non-inverting signal of a signal selected by the switch SW1 and the other input line 240-4 carrying an inverted signal of a signal selected by the switch SW1.

The output line 224-1 is connected to an OR sense circuit 214-1 which has its output terminal connected to a contact point a of a switch SW1, to an input terminal D of a register 216 and to a contact point b of a switch SW3. The register 216 has its output terminal Q connected to a contact point a of a switch SW3 and its other output terminal $\overline{Q}$ connected to a contact point b of the switch SW1 and to a contact point c of a switch SW2. The switch SW3 is connected to a three-state buffer circuit 226 which is also connected to the input/output terminal 236. In addition, the input/output terminal 236 is connected to a contact point c of the switch SW1, a contact point a of the switch SW2 and to an input terminal D of a register 242 which has its output terminal Q connected to a contact point b of the switch SW2.

At each of the cross-over point between the input lines 232 and 240 and the product term lines 220 and the cross-over points between the output lines 224 and the product term lines 220 is provided a programmable memory element which can be programmed to either a conducting state or a non-conducting state and which is preferably a reprogrammable memory transistor, such as a FAMOS or stacked-gate transistor.

In operation, when an input signal is applied to the device input terminal 230-1, it is supplied to the pair of input lines 232-1 and 232-2 through the driver circuit 234-1 and also to the pair of input lines 232-3 and 232-4 through the register 208 and the driver circuit 234-2 as synchronized by the register 208. Input signals are similarly supplied to the remaining input lines, such as 230-l. On the other hand, regarding the other set of input lines 240, an output signal from the OR sense circuit 214-1, an output signal from the output terminal $\overline{Q}$ of the register 216 or an input signal from the input/output terminal 236 is selectively supplied to the pair of input lines 240-3 and 240-4 by the switch SW1; whereas, an input signal from the input/output terminal 236, an output signal from the output terminal Q of the register 242 or an output signal from the output terminal $\overline{Q}$ of the register 242 is supplied to the pair of input lines 240-1 and 240-2 as selected by the switch SW2.

The three-state buffer circuit 226 is controlled by an enable signal OE, and when the three-state buffer circuit 226 is turned on, the input/output terminal 236 serves as an output terminal; on the other hand, when the three-state buffer circuit 226 is turned off, the input/output terminal 236 serves as an input terminal. The switch SW3 selects either one of an output signal from the OR sense circuit 214-1 and an output signal from the output terminal Q of the register 216, and it functions to supply either one of the two signals to the input/output terminal 236 as an output signal through the three-state buffer circuit 236.

Figure 13:
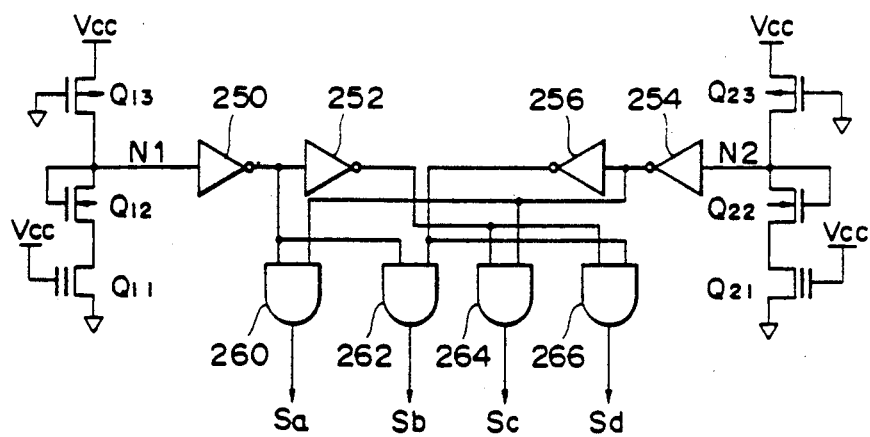
FIG. 13 is a schematic illustration showing a circuit for generating a selection signal in the structure shown in FIG. 12.
Figure 14:
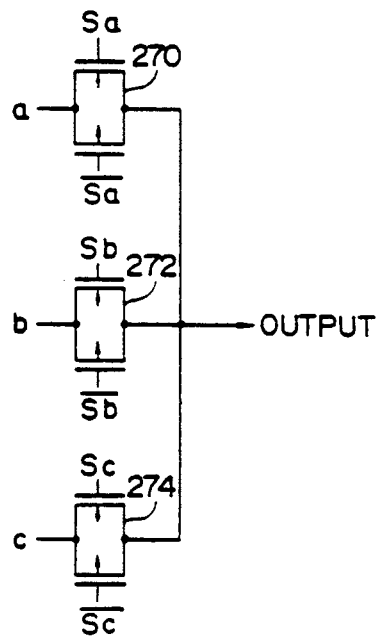
FIGS. 14 and 15 are schematic illustrations showing two alternative examples of a switch having three terminals which may be applied to the structure shown in FIG. 12.
Figure 15:
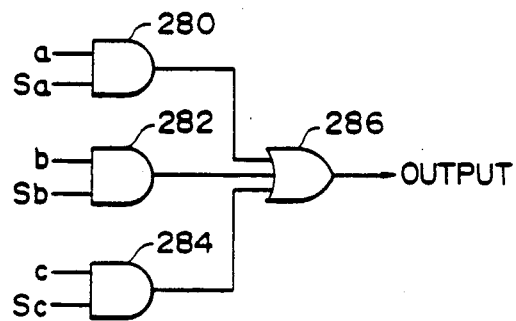

For example, if it is so structured that the register 216 is used as a state register for feed-back to the AND plane and the switch SW1 is connected to the contact point b, the input/output terminal 236 can be used as an independent input terminal as long as the switch SW2 is connected to either one of the contact points a and b. In this case, the pair of input lines 240-1 and 240-2 serves as input lines for a device input terminal, and the other pair of input lines 240-3 and 240-4 serves as input lines for a feed-back signal. In the structure shown in FIG. 12, the switches SW1 through SW3 may be formed using memory elements employed for forming an array in the AND and OR planes, transfer gates, and AND and OR gates. FIGS. 13 through 15 show examples of the switch when constructed using stacked-gate MOS transistors as memory elements.

FIG. 13 shows a switch circuit which uses two stacked-gate MOS transistors Q11 and Q12 and which supplies a high level output signal in one of four output signals Sa through Sd selectively. In a circuit provided with the stacked-gate MOS transistor Q11, an N-channel MOSFET Q12 and a P-channel MOSFET Q13, the MOSFET Q13 connected to a power supply voltage $V_{cc}$ serves as a pull-up load resistor and the MOSFET Q12 serves as a voltage limiting transistor for limiting the voltage to be applied to the drain of the MOSFET Q11. The control gate of the memory transistor Q11 is connected to the power supply voltage $V_{cc}$. A node N1 between the MOSFETs Q12 and Q13 is connected to one input terminal of each of AND circuits 260 and 262 through an inverter 250 and to one input terminal of each of AND circuits 264 and 266 through inverters 250 and 252 in series connection.

A circuit provided with the memory transistor Q21, and N-channel MOSFET Q22 and a P-channel MOSFET Q23 is constructed in a manner similar to the circuit provided with the memory transistor Q11, N-channel MOSFET Q12 and P-channel MOSFET Q13, and a node N2 between the MOSFETs Q22 and Q23 is connected to the remaining input terminal of each of the AND circuits 260 and 264 through an inverter 254 and to the remaining input terminal of each of the AND circuits 262 and 266 through inverters 254 and 256 in series connection. It is to be noted that a programming circuit for programming the memory transistors Q11 and Q21 is provided separately, but it is not shown in the drawing for the sake of simplicity.

When programming is effected for a FAMOS or stacked-gate MOS transistor, its threshold voltage increases beyond $V_{cc}$, thereby entering into a cut-off state, so that if the memory transistors Q11 and Q12 are programmed, then the nodes N1 and N2 are at high level. In this manner, depending on whether the memory transistors Q11 and Q21 are programmed or not, either one of the output signals (selection signals) Sa through Sd becomes high level as shown below in the form of a table.

|  | Q11 (programmed) | Q11 (deprogrammed) |
| --- | --- | --- |
| Q21 (programmed) | Sd | Sb |
| Q21 (deprogrammed) | Sc | Sa |

With these selection signals Sa through Sc supplied as gate signals for the three transfer gates 270, 272 and 274 shown in FIG. 14, there is obtained a switch for switching contact among the three contact points a, b and c. Similarly, using these selection signals Sa through Sd as control input signals to three AND circuits 280, 282 and 284 which form a switch circuit together with an OR circuit 286 when connected as shown in FIG. 15, there is obtained a switch for switching a contact among the three contact points a, b and c. A switch for switching a contact between two contact points may be constructed in a similar manner.

As described previously, in the case of the programmable logic device shown in FIG. 12, both of the AND and OR planes are programmable; however, this aspect of the present invention is equally applicable to other types of a programmable logic device in which one of the AND and OR planes is not programmable.

A still further aspect of the present invention will now be described with particular reference to FIGS. 17 through 19. FIG. 18 shows a programmable logic device which includes a programmable AND plane and a non-programmable OR plane and which also includes a three-state output buffer whose state is controlled by an internal product term. As shown, in the AND plane of the structure shown in FIG. 18, a plurality of input lines 302-1 through 302-m run vertically in parallel and they form pairs, each of which, such as input lines 302-1 and 302-2, is connected to an associated one of a plurality of input driver circuits 304-1 through 304-1. Thus, when an input signal I1 is applied to the input driver circuit 304-1, it appears without change on the input line 302-1 connected to the input driver circuit 304-1 and its inverted signal appears on the input line 302-2 connected to the input driver circuit 304-1. Also provided are a plurality of product term lines 306-1 through 306-n running in the horizontal direction and each of the product term lines 306-1 through 306-n is connected to an associated one of a plurality of AND sense amps 308-1 through 308-n at its right-hand end. The AND sense amps 308-2 through 308-n have their output terminals connected to the respective input terminals of an OR circuit 310 and the remaining AND sense amp 308-1 has its output terminal connected to a control input terminal of a three-state buffer circuit 312. Moreover, the output terminal of the OR circuit 310 is connected to a device output terminal 314 through the three-state buffer circuit 312.

Figure 19:
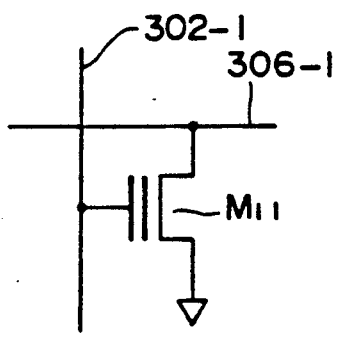
FIG. 19 is a schematic illustration showing a specific example of a programmable element for use in the structure shown in FIG. 17.

A matrix is defined by the vertically running input lines 302-1 through 302-m and the horizontally running product term lines 306-1 through 306-n, and a plurality of programmable memory elements M11 through Mnm, such as a stacked-gate MOS transistor shown in FIG. 19, are provided each at each of the cross-over points between the input and product term lines 302 and 306. Depending on whether the memory elements M11 through Mnm are programmed or deprogrammed, one of more of the input lines 302 may be electrically connected to one or more of the product term lines 306 selectively. As mentioned before, use may be made of various programmable or reprogrammable elements as the memory elements M11 through Mnm. It is to be noted that in the illustrated example the product term line 306-1 is connected to the control input terminal of the three-state buffer circuit 312. Thus, the operation to read an output signal from the OR circuit 310 from the device output terminal 314 is controlled by the product term line 306-1. It should also be noted that in reality two or more OR gates 310 are provided.

The programmable logic device shown in FIG. 18 is also provided with a test circuit. That is, as shown, the illustrated structure includes a test input line 316 which runs vertically in parallel with the other input lines 302 and which receives a test signal It. And, at the cross-over points between the test input line 316 and the product term lines 306-1 through 306-n are provided a plurality of memory elements Mt1 through Mtn same in kind as the memory elements provided in the AND plane. It is to be noted that no programming effected for these memory elements Mt1 through Mtn. Also provided is another set of vertically running input lines 318-1 through 318-n each of which is connected to the corresponding one of the product term lines 306-1 through 306-n through the corresponding one of a plurality of MOSFETs Q1 through Qn.

With the above-described programmable logic device provided with a test circuit, a logic test or measurements of input/output propagation time delay can be carried out without effecting programming to the memory elements M11 through Mnm. When the MOSFET Q1 is selected, i.e., selection signal D1 at high level and selection signals D2 through Dn at low level, the product term line 306-1 can be selected to be either low level or high level depending on input of the test singal It. In this case, the remaining product term lines 306-2 through 306-n are set at low level. With this structure, however, only either a high level state or a high impedance state appear at the output terminal 314. In addition, when the MOSFETs Q2 through Qn are selected in sequence, the product term line 306-1 is set at low level so that the output terminal 314 remains to be in the high impedance state, thereby hindering to carry out a test.

This aspect of the present invention is particularly directed to elimination of such disadvantages as described immediately above. FIG. 17 shows a programmable logic device constructed in accordance with a still further embodiment of the present invention, which is an improvement over the structure shown in FIG. 18. It is to be noted that those elements which are identical to those shown in FIG. 18 are indicated by identical numerals in FIG. 17. As shown in FIG. 17, an output signal from the product term line 306-1 is coupled to one input terminal of an OR circuit 320 whose output terminal is connected to the control input terminal of the three-state buffer circuit 312. The OR circuit 320 has its remaining input terminal connected to receive a test mode signal which is set in an enabled state during test mode. With this structure, the three-state buffer circuit 312 may be enabled by either an output signal from the product term line 306-1 or the test mode signal.

Figure 17:
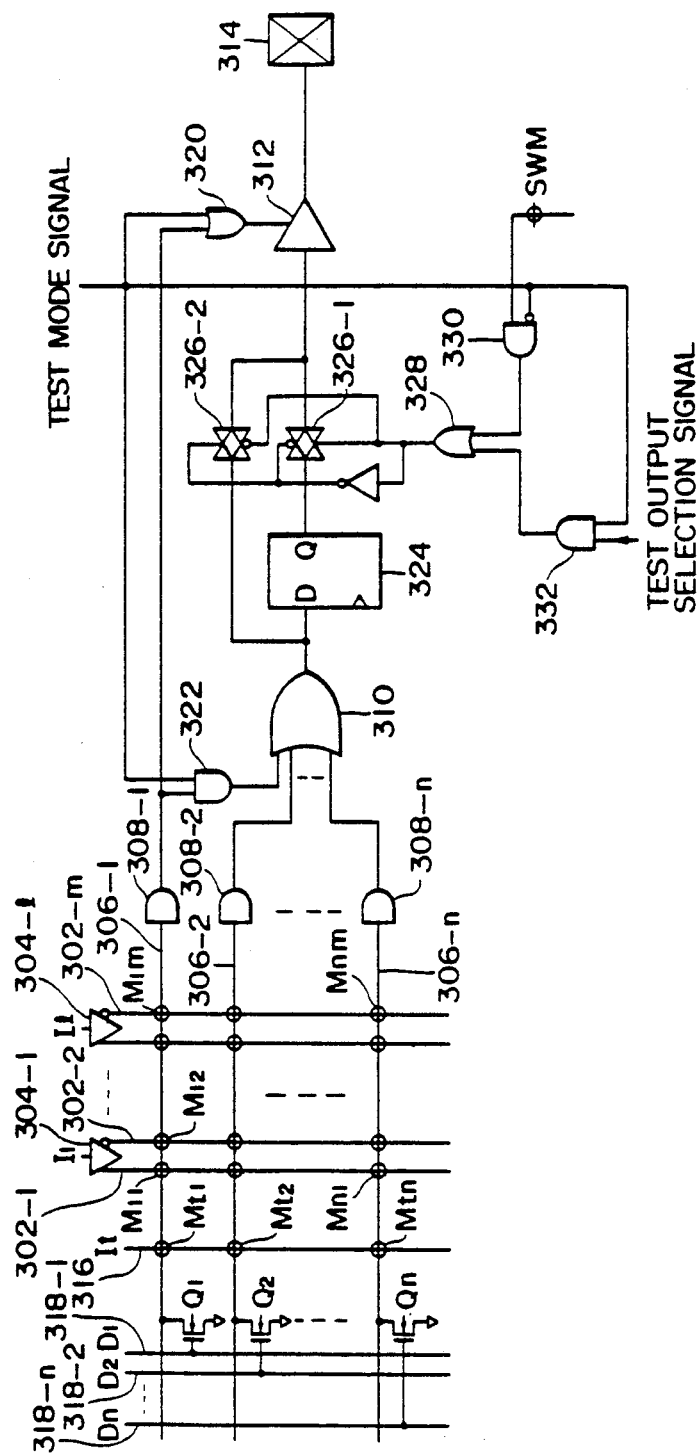
FIG. 17 is a schematic illustration showing a programmable logic device provided with a test circuit constructed in accordance with a still further embodiment of the present invention.
Figure 18:
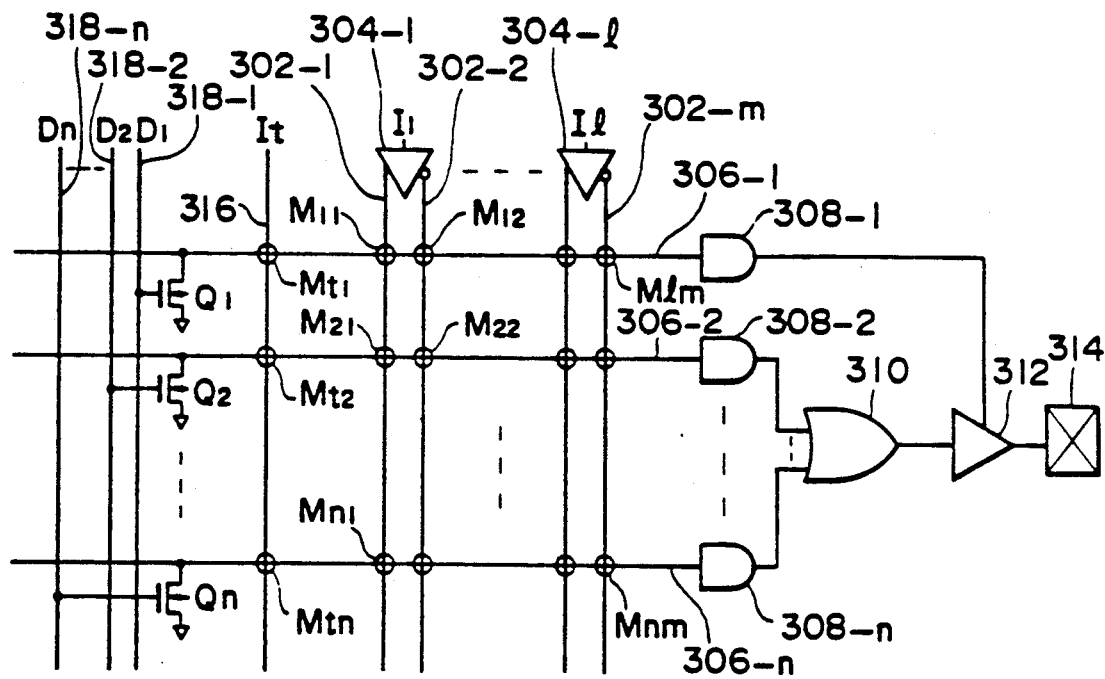
FIG. 18 is a schematic illustration showing a programmable logic device provided with a test circuit for comparison with the preferred structure shown in FIG. 17.

Also provided in the structure shown in FIG. 17 is an AND gate 322 which has its one input terminal connected to received an output signal from the product term line 306-1, its other input terminal connected to receive the test mode signal, and its output terminal connected to one input terminal of the OR circuit 310. With this structure, during test mode, an output signal from the product term line 306-1 can be input into the OR circuit 310. In addition, an output register 324 comprised of a flip-flop is connected between the OR circuit 310 and the three-state buffer circuit 312. Also provided is a pair of transfer gates 326-1 and 326-2 in association with the register 324, so that whether an output signal from the OR gate 310 should pass through the register 324 can be selectively determined by the transfer gates 326-1 and 326-2. Also provided is an OR circuit 328 whose output terminal is connected to the control input terminal of each of the transfer gates 326-1 and 326-2, whose one input terminal is connected to the output terminal of an AND circuit 330 and whose other input terminal is connected to the output terminal of an AND circuit 332. The AND circuit 330 has its one input terminal connected to a memory element SWM same in kind as those used in the AND plane and its other input terminal connected to receive an inverted test mode signal. On the other hand, the other AND circuit 332 has its one input terminal connected to receive a test output selection signal which is externally supplied through an external terminal and its other input terminal connected to receive the test mode signal.

In operation, during test mode, the test mode signal is set at high level. Thus, the output buffer 312 is enabled, thereby allowing to observe the interior condition through the output terminal 314. Besides, since the product term line 306-1 is connected to the OR circuit 310, it can be tested together with the remaining product term lines 306-2 through 306-n. In addition, during test mode, since the ANd circuit 330 is set in a disabled state and the AND circuit 332 is set in an enabled state, either one of the transfer gates 326-1 and 326-2 is set in a conducting state by the test output selection signal, thereby selecting whether an output signal from the OR circuit 310 is to pass through the output register 324 or not.

During normal mode (and not test mode), the test mode signal is set at low level. With this, an output signal from the product term line 306-1 is not input to the OR circuit 310, but input only to the control input terminal of the three-state buffer circuit 312. In addition, since the AND circuit 330 is set in an enabled state and the AND circuit 332 is set in a disabled state, either one of the transfer gates 326-1 and 326-2 is selected to be in a conducting state depending on the fact whether the memory element SWM is programmed or not.

It should be noted that a circuit portion including the OR circuit 328 and AND circuits 330 and 332 is useless unless the programmable logic device to which this aspect of the present invention is applied has a switching function of its output register. In addition, this circuit portion can be eliminated if there is no redundant external terminal during test mode and the test output selection signal cannot be produced. In this case, only one of the pass with the output register 324 or the pass without the output register 324 can be tested, but test can be conducted for the AND/OR plane.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A programmable logic device, comprising:
   a plurality of input terminals;
   an AND plane connected to said plurality of input terminals, said AND plane including a plurality of input lines extending in a predetermined direction, a plurality of product term lines extending in a direction transverse to said predetermined direction, and a plurality of programmable memory elements each disposed at each of cross-over points between said input and product term lines, said plurality of input lines being paired;
   an OR plane connected to said AND plane;
   at least one input-output terminal selectively connectable to at least one of said AND and OR planes; and
   wherein two pairs of said input lines are connected to at least one of said plurality of input terminals or to said input/output terminal and there are two independent feedback systems for selective feedback from said input/output terminal to said input lines; and
   wherein one of said paired input lines is an inverting input line and the remaining of said paired input lines is a non-inverting input line.

2. The device of claim 1 further comprising a plurality of driver circuits each of which is connected to a corresponding one of said plurality of input terminals and is connected to said paired inverting and non-inverting input lines.

* * * * *